US006822249B2

(12) United States Patent
Lee et al.

(10) Patent No.: US 6,822,249 B2
(45) Date of Patent: Nov. 23, 2004

(54) RADIOACTIVE ELECTRON EMITTING MICROCHANNEL PLATE

(75) Inventors: Minsoo Lee, Daejeon-si (KR); Hongsuk Chung, Daejeon-si (KR); Jae Hyung Yoo, Daejeon-si (KR); Hyun-Soo Park, Daejeon-si (KR)

(73) Assignees: Korea Atomic Energy Research Institute, Daejeon-si (KR); Korea Hydro & Nuclear Power Co., Ltd., Seoul (KR)

( * ) Notice: Subject to any disclaimer, the term of this patent is extended or adjusted under 35 U.S.C. 154(b) by 0 days.

(21) Appl. No.: 10/188,879

(22) Filed: Jul. 2, 2002

(65) Prior Publication Data

US 2003/0015661 A1 Jan. 23, 2003

(30) Foreign Application Priority Data

Jul. 23, 2001 (KR) .................................... 2001-44151

(51) Int. Cl.$^{7}$ .......................... H01J 37/08; H01J 7/24

(52) U.S. Cl. .......................... 250/492.23; 250/492.2; 250/496.1; 315/111.81

(58) Field of Search ........................ 250/492.3, 492.2, 250/492.1, 492.23, 496.1, 497.1, 315.3, 581, 398; 315/111.81, 111.71, 169.3, 169.4, 169.1

(56) References Cited

U.S. PATENT DOCUMENTS

| | | | | | |
|---|---|---|---|---|---|
| 5,378,960 | A | * | 1/1995 | Tasker et al. | 313/103 CM |
| 5,656,807 | A | * | 8/1997 | Packard | 250/214 VT |
| 5,656,887 | A | | 8/1997 | Voshell et al. | 313/496 |
| 5,864,146 | A | * | 1/1999 | Karellas | 250/581 |
| 6,014,203 | A | | 1/2000 | Ohkawa | 355/68 |
| 6,125,243 | A | | 9/2000 | Shoji et al. | 399/29 |
| 6,323,594 | B1 | * | 11/2001 | Janning | 313/495 |
| 6,384,519 | B1 | * | 5/2002 | Beetz, Jr. et al. | 313/103 CM |

* cited by examiner

*Primary Examiner*—Tuyet Thi Vo
(74) *Attorney, Agent, or Firm*—Bachman & LaPointe, P.C.

(57) ABSTRACT

The present invention relates to a radioactive electron emitting microchannel plate. More particularly, to a radioactive electron generating microchannel plate comprising (a) a pair of parallel substrates; (b) at least one radioactive material layer deposited on an inner surface of the substrates; and (c) at least one electron ray-amplifying layer deposited on the surface of the radioactive material layer. The emitted electron ray is amplified by penetrating into the cavity formed by a pair of parallel substrates and is further amplified by reflecting from the electron ray-amplifying layer. As the substrate in the microchannel plate, use can be made of a capillary tube or a thin plate. The microchannel plate of the present invention can be applied as an electron ray source in an electron ray-generating device, an image display device, and electron ray-etching device.

20 Claims, 6 Drawing Sheets

RADIOACTIVE ELECTRON EMITTING MICROCHANNEL PLATE

FIELD OF THE INVENTION

The present invention relates to a radioactive electron emitting microchannel plate. More particularly, to a radioactive electron emitting microchannel plate comprising (a) a pair of parallel substrates; (b) at least one radioactive material layer deposited on an inner surface of the substrates; and (c) at least one electron ray-amplifying layer deposited on the surface of the radioactive material layer.

BACKGROUND OF THE INVENTION

Electron rays, in general, are generated under electrically stringent conditions. To generate the electron ray from surfaces of metals and semiconductors, a high power electric field of 5 kV/$\mu$m or higher should be applied under vacuum. Also, negatively charged electrons should be concentrated in a limited spot to easily emit an electron ray. Such an electron ray-emitting device is referred to as an electron gun.

Difficulties of electron ray emission impose many restrictions on their use in industrial applications. For example, optical lithographic methods are usually used in manufacturing of an integrated circuit pattern. However, they are limited in their resolution by the wavelength of light. Electron ray lithography can provide better resolution than optical lithography, since it doesn't have the wavelength limitations of optical lithography. However Electron ray couldn't provide uniform projections on a large area of a wafer in sufficient radiation dose through a single irradiation. Hence, Electron ray have been limited to the fabrication of masks for light projection. In other cases, an image display device, such as a field emission display stimulates a fluorescent material using an electron ray to display an image. In order to generate the electron ray over the whole area of the image display device, many fine cathodic pins are arrayed on the plane. Accordingly, field emission display suffers from complicated structures, difficult fabrication, and shortened lifetimes due to abraded fine negative pins.

To overcome difficulties of artificial electron ray emission, an electron ray-emitting device using a radioactive material generating high-energy radiation is disclosed in U.S. Pat. Nos. 6,215,243 and 4,194,123. In these patents, high-energy radiations, such as alpha rays, beta rays, gamma rays, X-rays, and neutron beams, stimulate the electron ray-amplifying material and thus readily generate the electron ray. The electron ray-generating device using the radioactive material is advantageous in light of its simple flat type construction, in contrast to the complicated structure including the electron gun, but is still disadvantageous in terms of the low radiation dose. Therefore, sufficient amplification of the electron ray is required for application to various apparatuses.

In U.S. Pat. Nos. 6,046,714 and 4,194,123, a microchannel plate, which is an electron ray-amplifying device, is employed. In the microchannel plate, the electron ray passing through the inside of the capillary tube is amplified when reflected onto a wall face of an electron ray amplifying layer deposited on an inner surface of a glass capillary tube. The general microchannel plate structure comprises a bundle of glass capillary tubes, each having a diameter of 5–10 $\mu$m, formed in a flat plate being 3–5 cm thick. The microchannel plate has an amplification ratio to $10^3$, and two or three stacked microchannel plates have an amplification ratio of up to $10^7$.

In other methods for amplifying electron rays, U.S. Pat. No. 6,215,243 discloses a method for amplifying electron rays, in which the emitted electron ray is amplified while penetrating through alternately laminated insulating membrane and electron ray amplifying film, in a combination structure of a radiation emitting layer and an electron ray amplifying layer. This electron ray amplification method, however, has a disadvantage in that it is difficult to obtain a sufficient radiation dose. In the case of using the microchannel plate, large dosages of radiation are not introduced into the microchannel plate due to positioning of the radioactive material layer toward an exterior of the plate. As such, the amplified radiation dose is not sufficient. As for such a method, the thickly laminated amplification layer is required to sufficiently amplify the radiation dose. Though a secondary electron ray generated by radiation should be accelerated under high voltage and then further amplified, acceleration is not easily carried out in the solid inside and the energy is drastically decreased. Therefore, disclosed in conventional methods have still many problem so as to efficiently amplify the electron ray.

SUMMARY OF THE INVENTION

Leading to the present invention, the intensive and thorough research into a microchannel plate, carried out by the present inventors aiming to avoid the problems encountered in the prior arts, resulted in the finding that an electron ray-emitting microchannel plate comprising (a) a pair of parallel substrates; (b) at least one radioactive material layer deposited on an inner surface of the substrates; and (c) at least one electron ray-amplifying layer deposited on the surface of the radioactive material layer, whereby radioactive material layer is simultaneously combined with electron ray-amplifying layer within the microchannel plate and thus the generated electron ray is amplified by penetrating into the cavity formed by a pair of parallel substrates and is further amplified by reflecting from the electron ray-amplifying layer. Therefore, the microchannel plate emits a sufficient dose of electron ray and easily yields a high-energy beam.

Accordingly, it is an object of the present invention to provide an electron ray emitting a microchannel plate, in accordance with the first embodiment of the present invention, comprising (a) a pair of parallel substrates; (b) at least one radioactive material layer deposited on an inner surface of the substrates; and (c) at least one electron ray-amplifying layer deposited on the surface of the radioactive material layer.

It is another object of the present invention to provide an image display device, in which a cathode and a transparent electrode coated with fluorescent material layer are both positioned at the ends both of the top and the bottom of the capillary tube in the microchannel plate, respectively.

It is further object of the present invention to provide a microchannel plate, which is composed of a stack of thin plates, in accordance with the second embodiment of the present invention, comprising (a) a pair of parallel substrates; (b) at least one radioactive material layer deposited on an inner surface of the substrates; and (c) at least one electron ray-amplifying layer deposited on the surface of the radioactive material layer, wherein the substrate is a thin plate.

It is a further still object of the present invention to provide an electron ray etching device consisting of the microchannel plate suggested in this invention, wherein the electron ray etching device is further comprising an electromagnet focusing lens, a mask, an electron ray sensitive material film, and an electron ray inducing magnet.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention pertains to an electron ray emitting microchannel plate comprising (a) a pair of parallel substrates; (b) at least one radioactive material layer deposited on an inner surface of the substrates; and (c) at least one electron ray-amplifying layer deposited on the surface of the radioactive material layer, in which the substrate may be a capillary tube or a thin plate.

Figure 1A:
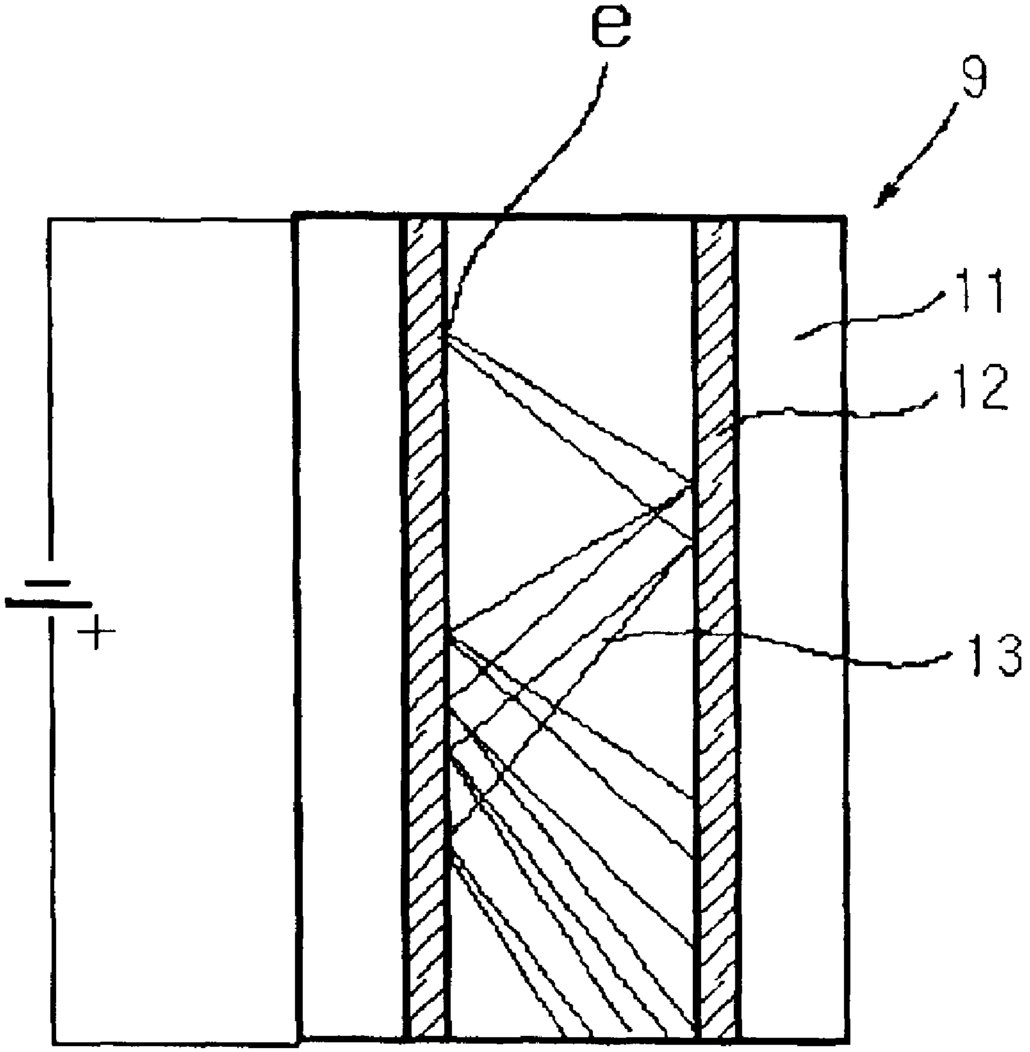
FIG. 1a PRIOR ART
FIG. 1*a* illustrates the principle of the amplification of an electron ray in conventional microchannel plate.

With reference to FIG. 1*a*, there is shown the principle of the amplification an electron ray in a microchannel plate. An electron ray (13) introduced into the microchannel plate (9), in general, is amplified, when it passes through a capillary tube (11), by reflecting from the electron ray-amplifying layer (12) deposited on the inner surface of the capillary tube (11).

More specifically, when an energy particle or an energy wave, such as beta particle, alpha particle, gamma ray, X-ray and neutron particle, collides with the electron ray-amplifying layer (12), several electron particles are induced. A voltage applied to the capillary tube accelerates the induced electron particles. Thus the electron particles having sufficient kinetic energy repeatedly collide with other inner surface of the amplifying layer (12), thereby tremendously amplifying electron particles in number.

Figure 1B:
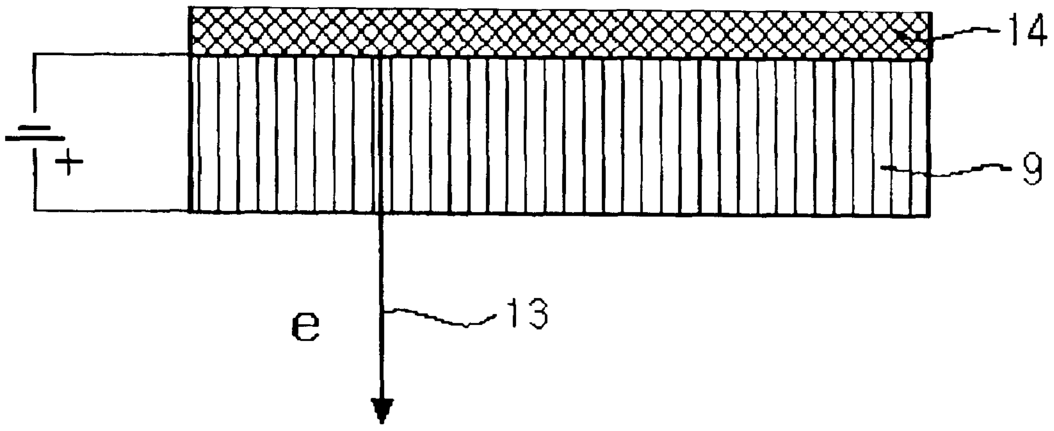
FIG. 1b PRIOR ART
FIG. 1*b* shows a previous flat type electron ray-generating device in combination with the radioactive material layer and a microchannel plate.

FIG. 1*b* shows a previously suggested flat type electron ray-generating device in combination with a flat type radiation-emitting layer and a microchannel plate. The flat type radiation-generating layer (14) is connected to the microchannel plate (9), and the electron ray (13) passing through the microchannel plate (9) is amplified in the same manner as described in FIG. 1*a*.

Figure 1C:
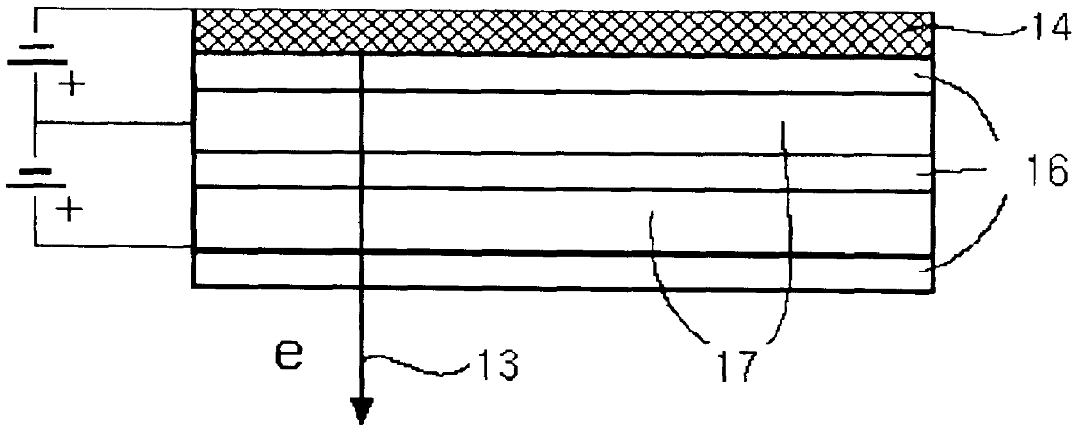
FIG. 1c PRIOR ART
FIG. 1*c* shows a previous flat type electron ray-generating device in combination with the radioactive material layer and an electron ray-amplifying layer.

FIG. 1*c* shows a previously suggested flat type electron ray-generating device in combination with a flat type radiation-generating layer and an electron ray-amplifying layer. The electron ray (13) emitted from the flat type radiation-generating layer (14) is amplified while penetrating through an insulating layer (16) and an electron ray-amplifying layer (17). In order to obtain the desired radiation dose, pluralities of the electron ray-amplifying layer (17) and the insulating layer (16) may be alternately stacked.

Figure 2:
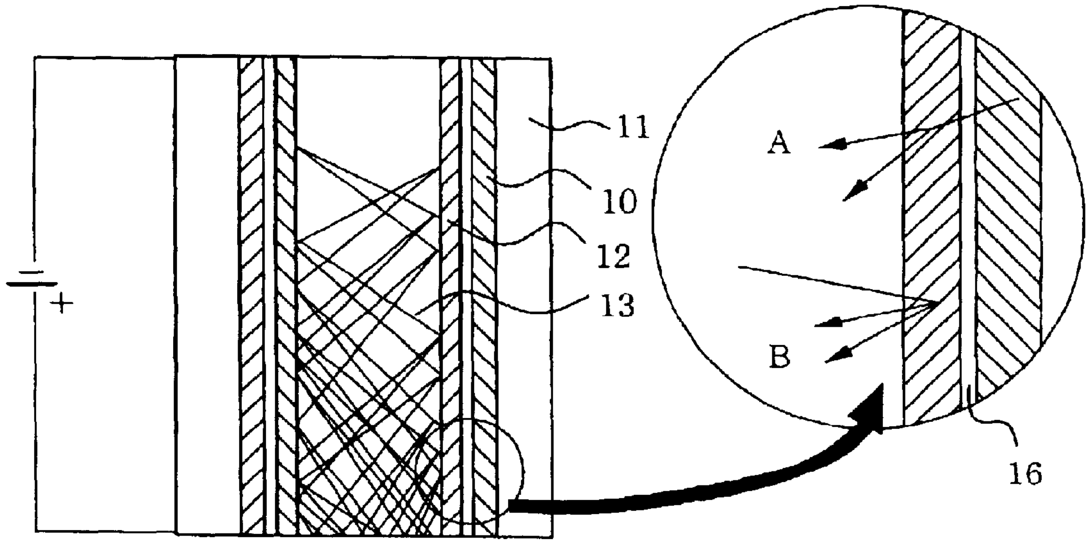
FIG. 2 illustrates a capillary type of the microchannel plate in which a radioactive material layer and an electron ray-amplifying layer are formed on the inner surface of capillary tube.

FIG. 2 illustrates a capillary type of the microchannel plate suggested in present invention, comprising (a) a capillary tube (11), which is formed by a pair of parallel substrates; (b) at least one radioactive material layer (10) deposited on an inner surface of the capillary tube; and (c) at least one electron ray-amplifying layer (12) deposited on the surface of the radioactive material layer (10), in which a high voltage should be plied to the cavity in the capillary tube (10) from the exterior. In some cases, the insulating layer (16) may be inserted between the radioactive material layer (10) and the electron ray-amplifying layer (12).

The radioactive material emitting radiation, such as beta rays, alpha rays, gamma rays, X-rays, and/or neutron can be used. And such radiations should be able to stimulate the electron ray-amplifying layer (12). Preferably, H-3, Ni-63, Tc-99, Pm-147 or Tl-204, each of which emits a beta ray, a type of an electron ray, is used alone or in combinations thereof. More preferably, tritium (T or H-3) is used.

The tritium (H-3), as an isotope of hydrogen, emits beta rays, and results in stable He-3 form due to its unstable nucleus having two excess neutrons. The half-life of tritium is 12.3 years, and tritium-containing material stably emits high-energy electron ray for a considerably long time, though having a low radiation dose.

Generally, in order to use the tritium as a practical electron ray source, the tritium gas, which is present in HT gas or $T_2$ gas should be fixed to a solid layer.

As a method of fixing the tritium on the solid layer, a hydriding metal or alloy is deposited on the solid surface in advance, and then the metal is tritided using tritium gas, thereby it fabricates a radioactive material layer. Therefore, radioactive material layer is a tritided metal, or a thin organic film in which a radioactive material is coated or deposited on the surface thereof. Especially, the radioactive material is H-3.

Due to the similar chemical characteristics between tritium and hydrogen, every metal capable of absorbing hydrogen can also absorb tritium. The quality of electron ray-generating sources significantly depends on the properties of tritium reserved-metal, which is selected the group consisting of Group IV or Group III actinides, or their alloys. The element of Group IV is consisting of titanium, zirconium and hafnium. And the element of Group III, for example, is uranium or thorium. Such metals have advantages of excellent ability of hydrogen absorption and can keep hydrogen at relatively high temperature without desorption. Besides, other alkali metals, such as lithium, magnesium, calcium, and strontium can be used as a tritium absorbing material. In addition to tritium absorbing, these alkali metals are capable of amplifying the electron ray emitted from tritium.

The metal layer is usually fixed on the inner surface of the capillary tube (11) by chemical vapor deposition, sputtering, or electroplating. Therefore, the metal layer becomes to be radioactive (10) after being treated with tritium gas at room temperature. The tritium gas is readily intercalated into the metal lattice and thus it can be sufficiently reserved even tens of atomic layers.

The tritided metal layer is preferably tens of nm to ones of μm thick, since the electron ray emitted from the tritium cannot penetrate over 10 $\mu$m thickness of a metal medium, so that the metal layer needs not be thick.

As other methods for fixing the tritium to the inner surface of the capillary tube, the inner surface of the capillary tube can be treated with an organic silanol or an organic chlorosilane, which is prepared by substituting hydrogen atoms with tritium atoms. The formed organic silicon thin film is strongly bonded to the inner surface of the capillary tube, and has excellent thermal stability. Examples of the organic silanol include $R_3SiOH$, $R_2Si(OH)_2$ and $RSi(OH)_3$, wherein R represents alkyl, cycloalkyl, alkoxy or cycloalkoxy. And examples of organic chlorosilane are $R_3SiCl$, $R_2SiCl_2$ and $RSiCl_3$, wherein R represents alkyl, cycloalkyl, alkoxy or cycloalkoxy.

Furthermore, the tritium substituted polymer film can be also used as a radioactive layer. As the polymeric materials it could be thermosetting polymer or thermoplastic polymer containing hydrogen within chains. Preferably, polyethylenes, polypropylenes or copolymers thereof, which are olefinic polymers, are used. These olefinic polymers should be crosslinked structure, so as to improve thermal stability.

Therefore, in order to make the radioactive material layer using tritium (10), thin tritide metal coatings, tritium substituted organic silicon coatings or a tritium substituted organic polymer coatings can be used. The use of thin metal tritide coatings, which have excellent stable preserving capability and high tritium capacity, is more favorable.

The electron ray-amplifying layer (12) of the present invention means that electron ray amplification can be developed by bombardment of energetic particles or waves generated from the radioactive material onto the layer.

As the electron ray-amplifying layer (12), used are mainly combinations or alloy of alkali metals, or alkaline-earth metals and other comprising of metals such as Cu, Ag, Au and W. Preferable alkali metals or alkaline-earth metals are Li, Mg, Ca, Sr and Ba. Commonly Cu/Be and Ag/Mg combinations are used for the amplifying layer. The combination of Ag, Au, and Pt metals, which hardly form hydride compounds, with alkali metals, results in blocking a diffusion of the tritided tritium from the radioactive material layer (10) to the electron ray-amplifying layer (12). The electron ray-amplifying layer (12) made of the metal alloy combination has amplified to a factor of 4–6 folds and is formed on the radioactive material layer (10) through a chemical vapor deposition.

In addition, the microchannel plate (9) may further comprise the thin insulating layer (16) inserted between the radioactive material layer (10) and the electron ray-amplifying layer (12) capable to penetrate the electron ray. Such insulating layer (16) is responsible for blocking the diffusion of ionic molecules or radioactive elements, such as tritium, from the radioactive material layer (10) to the electron ray-amplifying layer (12). Moreover, the insulating layer (16) plays a role in the introduction of the electron ray to the internal cavity by applying to a voltage across the radioactive material layer (10) and the electron ray-amplifying layer (12). As the insulating layer, use is made of insulating ceramics, which is selected the group consisting of SiC, $Al_2O_3$, and alkali metal oxide. Especially, the alkali metal oxide has an amplification effect when the electron ray is penetrated. For instance, in order to fix the alkali metal oxide film as an insulating layer (16) in the microchannel plate (9), the alkali metal film is deposited on the radioactive material layer (10), and forms an alkali metal oxide film by weakly oxidizing the film with oxygen. Thereafter, the electron ray-amplifying layer (12) is deposited on the insulating layer thereon.

The microchannel plate of the present invention is characterized in that the electron ray (13) emitted from the radioactive material layer (10) is amplified by penetrating into the cavity formed by a pair of parallel substrates (A) and is further amplified by reflecting from the electron ray-amplifying layer (12) applied with voltage of 1–3 kV (B).

The microchannel plate of the present invention characterizes in coexisting with the radioactive material layer and the electron ray-amplifying layer within one capillary tube. More particularly, the microchannel plate of the present invention characterized in that the electron ray naturally generated from the radioactive material in the capillary tube doubly amplified the electron ray through (A) penetration amplification and (B) reflection amplification simultaneously.

Therefore, the electron ray (13) traveling through the microchannel plate of the present invention, in which the electron ray collides with twice and higher between the radioactive material layer (10) and the electron ray-amplifying layer (12) in a capillary tube (11), can be maximized for the amplification.

In addition, the electron ray (13) is not simply amplified in the electron ray-amplifying layer (12), but is amplified in certain directions by applying high voltage along the traveling path of the electrons. Therefore, in the present invention, the voltage gap of 1 kV or higher should be applied to the cavity of the capillary tube, which is desirable to be maintained under a high vacuum so as to prevent loss of electrons.

On the other hand, the principal factors affecting the emission of electrons depend on material employed for the amplification layer; metal tritide's kind, thickness, and tritium content; capillary tube length; and capillary voltage gap; thus such factors may vary with various conditions.

The purpose of a conventional microchannel plate is to amplify a weak image signal, while a microchannel plate generates the electron ray as well as sufficiently amplifies it, thereby the microchannel plate itself can be useful for an electron ray-generating device. And it may be applied to an image display device utilizing the microchannel plate embedded radioactive material layer.

The present invention provides an image display device in which a cathode and a transparent electrode having a fluorescent material layer deposited thereon is respectively positioned at the ends of the top and the bottom of the capillary tube in the microchannel plate.

Figure 3:
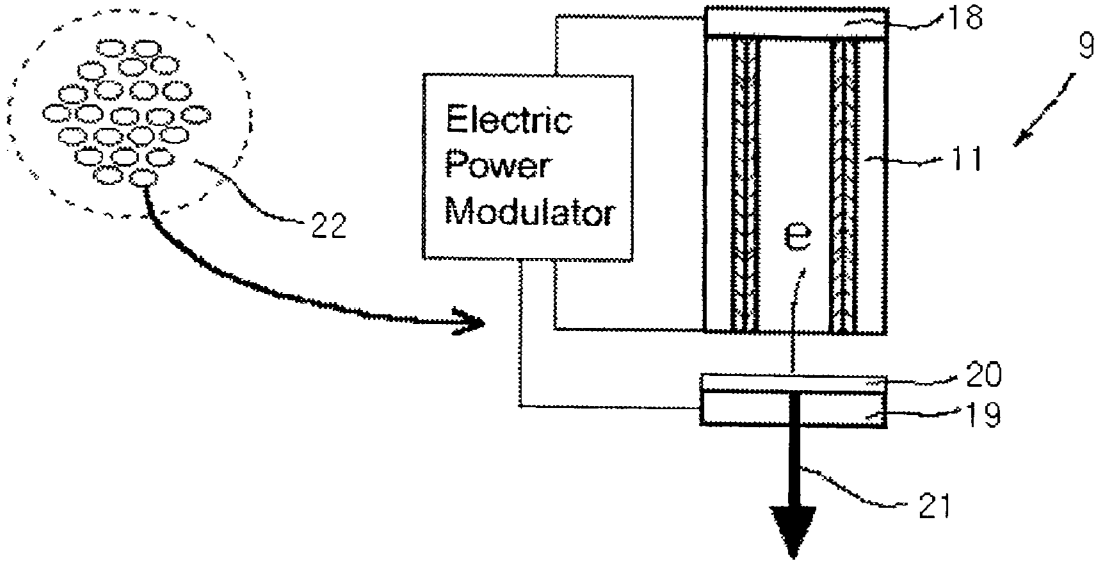
FIG. 3 shows an image display device containing the radioactive material layer-embedded in the capillary type of the microchannel plate.

FIG. 3 shows the image display device utilizing the microchannel plate embedded radioactive material layer, in which each voltage in capillary tubes arranged flat type in the microchannel plate, is electrically controlled and thus the image signal can be obtained. More specifically, when the cathode (18) and the a transparent electrode (19) coated with fluorescent material layer (20) are positioned at respective ends of the top and the bottom of the capillary tube in the microchannel, the emitted electron ray stimulates fluorescent material to emit the visible light (21). By electrically controlling the voltage between the two electrodes, the dose of electron ray and electronic energy introduced to fluorescent material layer (20) can be controlled, thus regulating the strength of the light in the fluorescent material layer (20). Hence, the electrical signal is displayed as the image signal on a dense plane (22), which is assembled plainly using a great number of capillary tubes.

The present invention also provides a microchannel plate comprising thin plate as a substrate. The thin plate type of the microchannel plate comprises (a) a pair of parallel thin plates; (b) at least one radioactive material layer deposited on an inner surface of the thin plate; and (c) at least one electron ray-amplifying layer deposited on the surface of the radioactive material layer.

Figure 4:
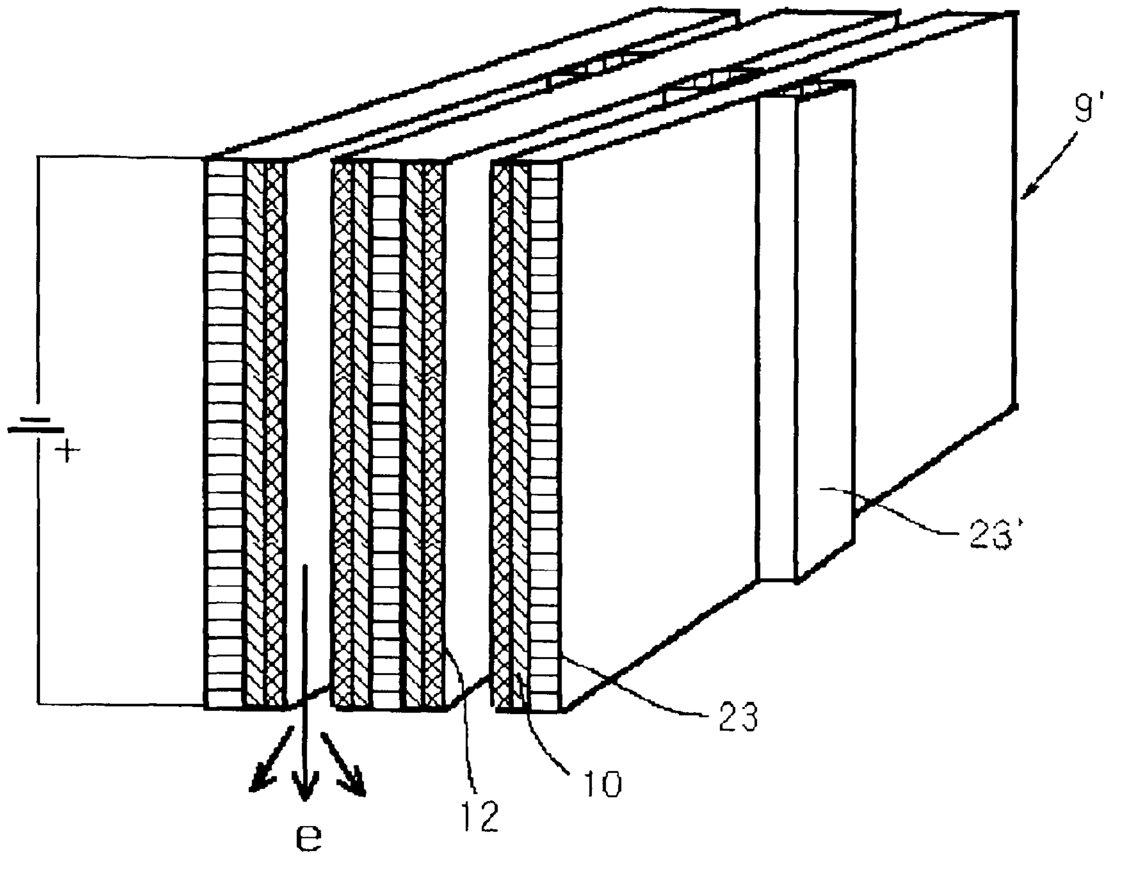
FIG. 4 shows a thin plate type of the microchannel plate in which a radioactive material layer and an electron ray-amplifying layer are surface-treated on the surface of thin plate.

Referring to FIG. 4, there is shown a multi-layered thin plate type of the microchannel plate. More particularly, radioactive material layer (10) is previously fixed on the surface of the thin plate (23) and then the electron ray-amplifying layer (12) deposited on radioactive material layer (10), thereby fabricating the multi-layered thin plate type of the microchannel plate (9') simply to pile up lots of thin plates.

The present invention further provides an electron ray-generating device. Examples of the microchannel plate that can be used in an electron ray-generating device include but are limited to, the capillary type of the microchannel plate and the thin plate type of the microchannel plate.

When the thin plate type of the microchannel plate is used, large numbers of thin glass plates are stacked at regular intervals created by the thin insulating separator (23') of about 10 $\mu$m in thickness positioned between the glasses (23), thereby fabricating the electron ray-generating device. Particularly, two or three multi-layered thin plate type of microchannel plates is directly connected in a Z-stack configuration, thus fabricating the thin plate type electron ray-generating device (29) with a maximal amplification effect of the electron ray.

The insulating separator (23') can be used any form of insulating materials if it can allow the regular space between the glasses. For instance, insulating materials, such as $SiO_2$, $Al_2O_3$, and other oxides can be utilized.

Figure 5:
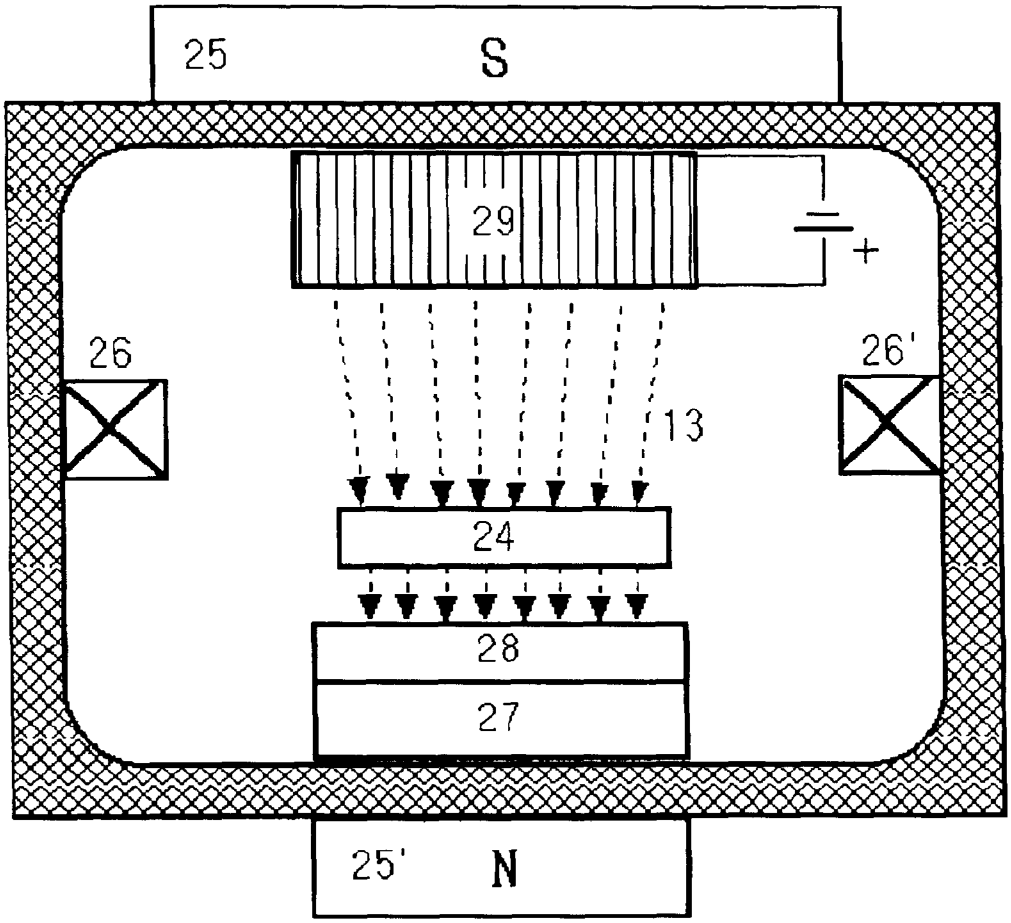
FIG. 5 shows an electron ray-etching device composed of the microchannel plate suggested in this invention.

The present invention further still provides an electron ray etching device including a electron ray-generating device (29), which alternatively comprising a capillary type or a multi-layered thin plate type of the microchannel plate, wherein the device is further comprising an electromagnet focusing lens (26 and 26'), a mask (24), an electron ray sensitive material film (28), and an electron ray inducing magnet (25 and 25') as shown in FIG. 5.

More particularly, the electron ray (13) emitted from a flat electron ray-generating device (29) travels under a strong magnetic field generated by electron ray inducing magnets (25 and 25') mounted to the upper and the lower surface of the etching device, and thus strongly induces to the mask (24). While passing through the mask, the mask image is transferred to the beam. The image focus is corrected with the electromagnet focusing lenses (26 and 26'). Finally, the image is irradiated to the electron ray sensitive material film (28) coated on a semiconductor wafer (27). The inside of the electron ray-etching device is a vacuum and thus the loss of the electron ray traveling through the internal space of the device is minimized.

Therefore, the multi-layered thin plate type electron ray-generating device (29) using the microchannel plate of the present invention is effectively used in the semiconductor wafer etching device, whereby a large surface on the semiconductor wafer can be readily photosensitized by the electron ray with only a single irradiation as same manner in exposure light. Based on these advantages, the electron ray-etching device of the present invention can be fabricated in a high-resolution circuit pattern as well as carried out quickly for etching.

A better understanding of the present invention may be obtained in light of the following examples which are set forth to illustrate, but are not to be construed to limit the present invention.

EXAMPLE 1

Preparation of Microchannel Plate Using Capillary Tube 1

A glass capillary tube having an outer diameter of 25 $\mu$m, an inner diameter of 10 $\mu$m, and a length of 1 mm is arrayed in parallel, thus making a flat plate 50 mm×50 mm. In the flat plate, a titanium metal film is formed on the inner surface of the capillary tube at about 100 nm thickness by a chemical vapor deposition. Thereafter, tritium is tritided in a saturation state under ambient conditions of temperature and pressure, and thus a radioactive material layer (10) having $TiT_2$ in stoichiometric amounts is formed, on which an electron ray-amplifying layer (12) comprising Cu/2%-Be is deposited at about 50 Å thickness with a simultaneous deposition treatment of Cu and Be, thereby preparing a microchannel plate (9) using the capillary tube.

The amount of titanium deposited on the inner surface of one capillary tube is about $2.8\times10^{-8}$ g based on titanium metal density, 4.5 g/cm$^3$. Therefore, the theoretical maximum number of electrons generated is about $1.3\times10^6$ electron/s, and the amount of tritium is about $3.5\times10^9$ g in the titanium metal layer containing $TiT_2$ stoichiometrically. However, the number of actual electrons capable of penetrating through the titanium metal layer is decreased due to the dispersion or absorption by surrounding medium, and the lower the energy of the electron ray, the more readily the beam is absorbed by the medium. The relationship of electronic energy to the penetration distance is as follows:

$$R \approx (1/\rho)\ 0.44E^{(1.265-0.09541nE)}$$

(Wherein, R represents a penetration distance ($\mu$m), ρ is a density (g/cm$^3$) and E is energy of electron (MeV)).

The penetration distance R is about 1.4 $\mu$m at maximal energy of the electron ray emitted from tritium of 18.6 keV, and about 0.1 $\mu$m at average energy of electron ray of 5.69 keV. Accordingly, the electrons having average energy or higher, emitted from tritium, penetrate through the titanium metal layer. At 3.0 keV having a maximum frequency, R is drastically decreased to about 0.024 $\mu$m and thus the electrons penetrated through the titanium metal layer to only 24% of the depth in the metal layer. On the other hand, at the energy of 3.0 keV or lower, the electrons are emitted only from the shallow surface of the titanium metal layer. Meanwhile, the electron ray-amplifying layer (12) has lower thickness and density than the titanium metal layer (10), thus reducing the energy of the electron ray. Not all electrons emitted in the manner as mentioned above could be discharged from the titanium metal layer, but at least 60% of electrons could be sufficiently discharged from the metal layer. The radiation is emitted in all directions, so that the probability of an electron being emitted in a positive direction, i.e., facing the internal cavity, is about half. Therefore, a number of electrons corresponding to at least 30% of the electrons, emitted from the tritium in the titanium metal layer, are transferred to the cavity of the capillary tube. While passing through the Cu/2%-Be electron ray-amplifying layer, the 30% of electrons are amplified by a factor of 4–6 folds, and are further amplified by a reflection amplification effect while passing through the cavity. Commonly, when passing through capillary tube with a diameter of 10 $\mu$m and a length of 1 mm applied with a voltage of −1.5 kV, one electron is amplified about up to $10^3$. However, in radioactive material layer-embedded microchannel plate of the present invention, the electron ray is directly emitted from the inside of the capillary tube, whereby the amplification ratio is determined by along the length of capillary tube. If the amplification ratio in the electron ray-amplifying layer (12) is at least 4, the electron numbers amplified in each length within the cavity are represented by $N_{am} \propto L^4$, wherein L is a distance from the outlet of the capillary tube. When the integral of L is calculated, the amplification ratio in the cavity of a capillary tube being 1 mm long is approximately 200. Hence, the current generated by the electrons finally emitted from the capillary tube is given by: generated electron numbers per seconds ($1.3\times10^6$ electrons/s)×probability to be transferred to cavity (0.3)×initial amplification ratio (4)×amplification ratio in cavity (~200)≈$3.1\times10^8$ electron/s, which corresponds to about $5\times10^{-5}$ μA, the final emission current.

In order to obtain high flux of electron ray, two or three microchannel plates of the above Example 1 can be directly stacked in a Z-stack configuration, thereby amplifying the emission of electron ray by a factor of $10^4$–$10^6$.

EXAMPLE 2

Preparation of Microchannel Plate using Capillary Tube 2

A glass capillary tube having an outer diameter of 25 μm, an inner diameter of 10 μm, and a length of 1 mm is arrayed in parallel, thus making a flat plate 50 mm×50 mm. In the flat plate, a titanium metal layer is formed on the inner surface of the capillary tube at about 100 nm thickness by a chemical vapor deposition. Thereafter, tritium is tritided in the saturation state under ambient conditions of temperature and pressure, and thus a radioactive material layer (10) having $TiT_2$ in stoichiometric amounts is formed. An insulating layer (16) comprising SiC is formed to a thickness of tens of Å thickness on the $TiT_2$ layer through a chemical vapor deposition. The electron ray-amplifying layer (12) is deposited to about 50 Å thickness of Cu/2%-Be with a chemical vapor deposition of Cu and Be on the insulating layer, thereby preparing a microchannel plate (9).

EXAMPLE 3

Preparation of Multi-layered Thin Plate Type of the Microchannel Plate

On a thin glass plate (23), having a width of 10 mm, a length of 1 mm, and a thickness of 20 μm, silica particles having a diameter of 5 μm are sparsely dispersed and annealed at elevated temperature on a single layer to a density of 10~40 particles/mm$^2$, and then 400 of the glass (23) are stacked in parallel, thus making a flat plate being 10 mm wide, 1 mm long, and 1 mm thick. This silica particle layer is used for the insulating separator (23'). A titanium metal layer having a thickness of about 100 nm is formed on both surfaces of the glass (23) through a chemical vapor deposition method, and then tritium is tritided in a saturation state at room temperature under atmospheric pressure, thus forming the radioactive material layer (10). The electron ray-amplifying layer (12) comprising Cu/2%-Be is deposited to about 50 Å thickness on the radioactive material layer, thus fabricating a multi-layered thin plate type of the microchannel Plate (9').

The multi-layered thin plate type of the microchannel Plate (9') itself can be useful for an electron ray-generating device based on sufficiently amplifying of electron ray. For its large amplification effect, the microchannel plate prepared in Example 3 could be used as an electron ray-generating device (29).

EXAMPLE 4

Preparation of Image Display Device using Capillary type Microchannel Plate

The microchannel plate (9) prepared in the above Example 1 is stacked in three layers having a Z configuration, in which each layer is spaced apart from the next layer at a 10 μm interval. A voltage of −1.5 kV is applied to each microchannel plate. A transparent electrode (19) coated with fluorescent material layer (20) is positioned apart from a terminal of a final capillary tube in the microchannel plate at a 100 μm interval using the insulating layer (16). A voltage of −1 kV is applied to the space between the terminal of the capillary tube (11) and the fluorescent material layer (20), and thus the electron ray (13) emitted from the terminal of the capillary tube (11) is accelerated. The electron-traveling space is sealed and maintained in a vacuum state of $10^{-6}$ torr. Each capillary tube (11) in the microchannel plate (9) is connected to a power conversion apparatus and is designed to control the voltage. In addition, an external image signal is input to the power conversion apparatus and converted to the voltage of each capillary tube (11). Thereby, the image display device having maximum 2000×2000 pixels in 50 mm×50 mm plane can be fabricated.

In order to obtain sufficient radiation dose, an emission current required for a general image display device should be about 10 A/cm$^2$ or larger. In the case of the three layer-laminated plate using the capillary tube with an inner diameter of 10 μm in the above Example 1, each capillary tube has an amplification ratio of $10^4$–$10^6$, therefore an emission current of 0.64–64 A/cm$^2$ can be obtained. To increase fluorescent efficiency, the electron ray-amplifying layer (12) may be formed on the surface of the fluorescent material layer (20). When a single electron is once reflected in the capillary tube applied with 1.5 keV, the electron ray is amplified a factor of 4–6 folds and thus finally amplified 100~1000 folds after 4–5 reflection times passing through the capillary. Consequently, the kinetic energy of electrons emitted from the outlet is at least 300–400 eV, which is voltage enough to stimulating the fluorescent material layer (20) to emit the visible light (21). The electrons emitted from the outlet are once more accelerated to the fluorescent material layer (20) by the applied voltage between the capillary end and the transparent electrode (19) and thus the kinetic energy of the electrons becomes more amplified. Therefore, the microchannel plate prepared in Example 1 can be used as an image display device.

EXAMPLE 5

Preparation of Electron ray Etching Device Using A Multi-layered Thin Plate Type of the Microchannel Plate An airtight chamber is connected to a vacuum pump and the inner pressure is maintained at $10^{-6}$~$10^{-7}$ torr. An electron ray-generating device (29) consisting of the microchannel plate prepared in Example 3 is positioned in the top of the chamber while downwardly facing the electron ray emitting side. The semiconductor wafer (27) on which electron ray sensitive material film (28) is coated is positioned in the bottom of the chamber apart from electron ray-generating device (29). Meanwhile, the electron ray mask (24) is located between the electron ray-generating device (29) and the semiconductor wafer (27). And the S pole of the electromagnet (25) composed of a solenoid is installed on the top of the outside chamber and the N pole (25') in the bottom of the outside chamber, the magnetic field of 1–2 tesla is uniformly maintained in a direction perpendicular to the electron ray emitting face, and the mask (24) and semiconductor wafer (27) within the chamber. About 1–3 kV is applied to a thin plate type electron ray-generating device (29). Between the mask (24) and the semiconductor wafer (27), the doughnut-shaped electromagnet focusing lenses (26 and 26') having a magnetic flux density of 1–30 gauss are positioned, through which the electron ray (13) is passed from the electron ray emitting face to the surface of the semiconductor wafer (27). The position of the electromagnet focusing lenses (26 and 26') can be precisely controlled since they were attached to an XY stage micro operator.

Accordingly, the electron ray-etching device of the present invention concludes that a large surface on the semiconductor wafer is readily photosensitized with only a single irradiation by an electron ray-generating device (29), a electron ray-generating device (29), which alternatively comprising a capillary type or a multi-layered thin plate type of the microchannel plate.

As described above, the microchannel plate of the present invention comprises (a) a pair of parallel substrates; (b) at least one radioactive material layer deposited on an inner surface of the substrates; and (c) at least one electron ray-amplifying layer deposited on the surface of the radioactive material layer. The electron ray generated from the radioactive material is amplified by penetrating into the cavity formed by pair of substrates and is further amplified by reflecting from the electron ray-amplifying layer. With optimized amplification effect, the microchennel plate of the present invention is, but not limited to, a capillary tube type or a thin plate type, can be achieved. Additionally, in the microchannel plate of the present invention, the voltage of the capillary tube is controlled, so that the plate can be utilized as the image display device. Moreover, the electron ray-generating devices suggested in this invention can be applied to manufacture the electron ray etching device, capable of once irradiating a wafer of large area, and able to be used as the electron ray generating source in an electron microscope and a mass spectrometer.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An electron ray-emitting microchannel plate, comprising:

(a) a pair of parallel substrates;

(b) a pair of radioactive material layer deposited on an inner surface of said each substrate;

(c) a pair of electron ray-amplifying layers deposited on an inner surface of said each radioactive material layer;

(d) a cavity formed between said pair of electron ray-amplifying layer; and (e) a power supply which applies a voltage to said pair of electron ray-amplifying layer.

2. The microchannel plate as set forth in claim 1, wherein an electron ray generated from radioactive material layer is amplified by penetrating into the cavity and is further amplified by reflecting from the electron ray-amplifying layer.

3. The microchannel plate as set forth in claim 1, wherein said pair of parallel substrates is a thin plate.

4. The microchannel plate as set forth in claim 1, wherein said radioactive material is selected from the group consisting of H-3, Ni-63, Sr-90, Tc-99, Pm-147, Tl-204 and combinations thereof which generates beta rays.

5. The microchannel plate as set forth in claim 1, wherein said radioactive material layer has a metal layer which is fixed on the inner surface of said substrate by chemical vapor deposition, sputtering, or electroplatin.

6. The microchannel plate as set forth in claim 1, wherein said radioactive material layer is the tritided metal layer which is from tens of nanometers to several of micrometers thick.

7. The microchannel plate as set forth in claim 1, wherein said power supply applies 1–3 k voltage to said pair of electron ray-amplifying layer.

8. The microchannel plate as set forth in claim 1, wherein said power supply is applied along the traveling path of the electrons and wherein said cavity is maintained under a high vacuum.

9. The microchannel plate as set forth in claim 1, wherein said pair of parallel substrates is capillary tube.

10. An image display device comprises;

(a) a microchannel plate of claim 9;

(b) a cathode positioned on the top of the microchannel plate;

(c) a transparent electrode coated with a fluorescent layer, positioned thereon the bottom of the microchannel plate; and (d) an electric power modulator controlling the applied voltages of each capillary tube in the microchannel plate.

11. The microchannel plate as set forth in claim 1, wherein said radioactive material layer is tritided metal which is coated or deposited on the inner surface of said each substrate.

12. The microchannel plate as set forth in claim 11, wherein said radioactive material layer is tritium reserved-metal which is selected from the group consisting of Group IV including titanium, zirconium and hafnium or Group III actinides including uranium and thorium.

13. The microchannel plate as set forth in claim 1, wherein radioactive material layer is a thin organic film which is coated or deposited on said inner surface of said each substrate.

14. The microchannel plate as set forth in claim 13, wherein said thin organic film is selected from the group consisting of organic silicon and a crosslinked organic polymer.

15. The microchannel plate as set forth in claim 13, wherein said inner surface of said each substrate is fixed by tritium with the method that said inner surface of said each substrate treated with an organic silanol or an organic chlorosilane, which is prepared by substituting hydrogen with tritium atom.

16. The microchannel plate as set forth in claim 1, wherein said microchannel plate is further comprising an insulating layer, which is inserted between said radioactive material layer and said electron ray-amplifying layer.

17. The microchannel plate as set forth in claim 16, wherein said insulating layer is made of an insulating ceramic.

18. The microchannel plate as set forth in claim 17, wherein said insulating ceramic is selected from the group consisting of SiC, $Al_2O_3$, and alkali metal oxide.

19. An electron ray-generating device comprising:

(1) a power supply which applies a voltage to at least two electron ray-emitting microchannel plates; and (2) at least two electron ray-emitting microchannel plates, said each electron ray-emitting microchannel plate is stacked at regular intervals created by the thin insulating separator of about 10 $\mu$m in thickness positioned between said each electron ray-emitting microchannel plate, where said electron ray-emitting microchannel plate comprising:

(a) a pair of parallel thin plate;

(b) a pair of radioactive material layers deposited on an inner surface of said each thin plate; and (c) a pair of electron ray-amplifying layers deposited on an inner surface of said each radioactive material layers.

20. An electron ray etching device comprising:

(1) an chamber in which an inner pressure is maintained from $10^{-6}$ to $10^{-7}$ torr;

(2) an electron ray-generating device of claim 19, which is positioned in the top of the chamber with downwardly facing the electron ray emitting side;

(3) a semiconductor wafer on which electron ray sensitive material film is coated, which is positioned in the bottom of said chamber apart from said electron ray-generating device;

(4) an electron ray mask which is located between said electron ray-generating device and said semiconductor wafer;

(5) an electromagnet of which the S pole is installed on the top of the outside chamber and the N pole in the bottom of the outside chamber, which uniformly maintains the magnetic field of 1–2 tesla in a direction perpendicular to said electron ray emitting side, said electron ray mask and said semiconductor wafer;

(6) a power supply which applies about 1–3 kV to said electron ray-generating device; and (7) two electromagnet focusing lenses which have a magnetic flux density of 1–30 gauss, which are positioned so that the electron ray is passed from said electron ray emitting side to the surface of said semiconductor wafer.

* * * * *